US008324928B2

(12) United States Patent
Kim

(10) Patent No.: US 8,324,928 B2
(45) Date of Patent: Dec. 4, 2012

(54) CALIBRATION CIRCUIT

(75) Inventor: Jun-bae Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/026,734

(22) Filed: Feb. 14, 2011

(65) Prior Publication Data

US 2011/0204869 A1 Aug. 25, 2011

(30) Foreign Application Priority Data

Feb. 23, 2010 (KR) ........................ 10-2010-0016341

(51) Int. Cl.
*H03K 17/16* (2006.01)

(52) U.S. Cl. ........................................................ 326/30

(58) Field of Classification Search .................... 326/30; 330/86, 76, 105, 110, 144
See application file for complete search history.

(56) References Cited

U.S. PATENT DOCUMENTS

2004/0124902 A1* 7/2004 Choe ............................ 327/334
2006/0087339 A1* 4/2006 Chung et al. .................... 326/30
2009/0146683 A1* 6/2009 Kim ............................... 326/30
2009/0267642 A1* 10/2009 Pan ................................ 326/30
2010/0060316 A1* 3/2010 Kim et al. ....................... 326/30

FOREIGN PATENT DOCUMENTS

JP 2008-228332 9/2008
JP 2009-021705 1/2009
KR 1020070044790 4/2007

* cited by examiner

*Primary Examiner* — Thienvu Tran
(74) *Attorney, Agent, or Firm* — F. Chau & Associates, LLC

(57) ABSTRACT

A calibration circuit includes a pad connected between an external resistor connected to a first voltage source and a first node, a first resistor unit connected between the first node and a second voltage source, a second resistor unit connected between a second node and the second voltage source, a first control unit for generating and outputting a first output signal, a first pull-down circuit connected between the second node and the first voltage source, a second pull-down circuit connected between a third node and the first voltage source, a second control unit for generating and outputting a second output signal, and a pull-up circuit connected between the third node and the second voltage source.

11 Claims, 11 Drawing Sheets

CALIBRATION CIRCUIT

CROSS-REFERENCE TO RELATED APPLICATIONS

This application claims the benefit of Korean Patent Application No. 10-2010-0016341, filed on Feb. 23, 2010, in the Korean Intellectual Property Office, the disclosure of which is incorporated herein in its entirety by reference.

BACKGROUND

The inventive concept relates to a calibration circuit, and more particularly, to a calibration circuit that may reduce a calibration time.

In order to prevent errors from occurring when semiconductor devices transmit and receive data, impedances of the semiconductor devices should be matched to one another. To this end, the semiconductor devices use terminating resistors. In order to fix the resistance of a terminating resistor to an accurate value, a calibration circuit is used.

SUMMARY

According to an aspect of the inventive concept, there is provided a calibration circuit including a pad connected between an external resistor connected to a first voltage source and a first node, a first resistor unit connected between the first node and a second voltage source and having an impedance that is determined in response to a first control signal, a second resistor unit connected between a second node and the second voltage source and having an impedance that is determined in response to a second control signal, a first control unit for generating and outputting a first output signal by using a voltage level of the first node and a voltage level of the second node, a first pull-down circuit connected between the second node and the first voltage source and having an impedance that is determined in response to the first output signal, a second pull-down circuit connected between a third node and the first voltage source and having an impedance that is determined in response to the first output signal, a second control unit for generating and outputting a second output signal by using a voltage level of the third node and a voltage level of a reference voltage, and a pull-up circuit connected between the third node and the second voltage source and having an impedance that is determined in response to the second output signal.

The first control unit may generate and output the first output signal that determines the impedance of the first pull-down circuit so that the voltage level of the first node is the same as the voltage level of the second node, and the second control unit may generate and output the second output signal that determines the impedance of the pull-up circuit so that the voltage level of the third node is the same as the voltage level of the reference voltage.

The reference voltage may have the voltage level that ranges between a voltage level of the first voltage source and a voltage level of the second voltage source.

According to an aspect of the inventive concept, there is provided a calibration circuit including a pad connected between an external resistor connected to a first voltage source and a first node connected to a second voltage source, a first control unit for generating and outputting a first output signal by using a voltage level of the first node and a voltage level of a second node connected to the second voltage source, a first pull-down circuit connected between the second node and the first voltage source and having an impedance that is determined in response to the first output signal, a second pull-down circuit connected between a third node and the first voltage source and having an impedance that is determined in response to the first output signal, a second control unit for generating and outputting a second output signal by using a voltage level of the third node and a voltage level of a reference voltage, and a pull-up circuit connected between the third node and the second voltage source and having an impedance that is determined in response to the second output signal.

The calibration circuit may further include a first switching unit for controlling whether to connect the second voltage source to the first node in response to an enable signal, and a second switching unit for controlling whether to connect the second voltage source to the second node in response to the enable signal.

According to another aspect of the present invention, there is provided a calibration circuit including a pad connected between an external resistor connected to a first voltage source and a first node connected to a second voltage source, a first control unit for generating and outputting a control signal by using a voltage level of the first node and a voltage level of a second node, a first resistor unit connected between the second node and the first voltage source and having an impedance that is determined in response to the control signal, a second resistor unit connected between a third node and the first voltage source and having an impedance that is determined in response to the control signal; and a calibration unit for performing a calibration operation by using a voltage level of the third node.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
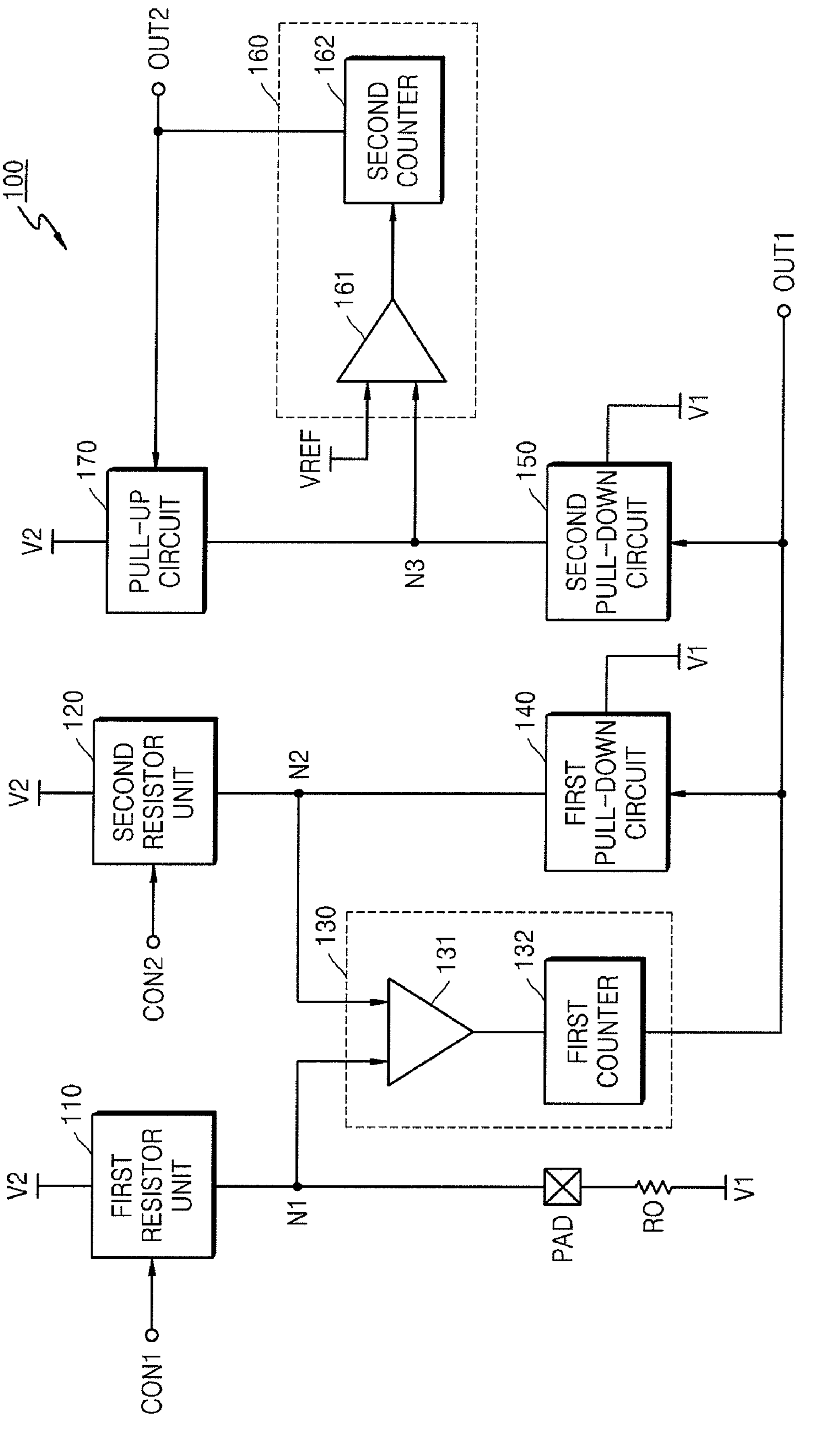
FIG. 1 is a block diagram of a calibration circuit according to an embodiment of the inventive concept.

In order to fully understand operational advantages of the inventive concept and objectives to be attained by embodiments of the inventive concept, the accompanying drawings illustrating exemplary embodiments of the inventive concept and details described in the accompanying drawings should be referred to.

The inventive concept will now be described more fully with reference to the accompanying drawings, in which exemplary embodiments of the inventive concept are shown. In the drawings, the same reference numerals denote the same elements.

FIG. 1 is a block diagram of a calibration circuit 100 according to an embodiment of the inventive concept.

Referring to FIG. 1, the calibration circuit 100 includes a pad PAD, a first resistor unit 110, a second resistor unit 120, a first control unit 130, a first pull-down circuit 140, a second pull-down circuit 150, a second control unit 160, and a pull-up circuit 170.

The pad PAD may be connected between a first node N1 and an external resistor RO that is connected to a first voltage source V1. The first voltage source V1 may be a voltage source that supplies a ground voltage.

The first resistor unit 110 is connected between the first node N1 and a second voltage source V2 and has an impedance that is determined in response to a first control signal CON1. The second voltage source V2 may be a voltage source that supplies a power voltage. The second resistor unit 120 is connected between a second node N2 and the second voltage source V2 and has an impedance that is determined in response to a second control signal CON2. The first resistor unit 110 and the second resistor unit 120 will be explained in detail later with reference to FIGS. 2A through 2C.

The first control unit 130 may generate and output a first output signal OUT1 by using a voltage level of the first node N1 and a voltage level of the second node N2. That is, the first control unit 130 may generate and output the first output signal OUT1 that determines an impedance of the first pull-down circuit 140 so that the voltage level of the first node N1 is the same as the voltage level of the second node N2. For example, if the external resistor RO has a resistance of 240Ω and each of the impedances of the first resistor unit 110 and the second resistor unit 120 is 240Ω, the impedance of the first pull-down circuit 140 may be determined to be 240Ω in response to the first output signal OUT1. Alternatively, if each of an impedance of the external resistor RO and the impedance of the first resistor unit 110 is 240Ω and the impedance of the second resistor unit 120 is 480Ω, the impedance of the first pull-down circuit 140 may be determined to be 480Ω in response to the first output signal OUT1. That is, the first control unit 130 may output the first output signal OUT1 that may determine the impedance of the first pull-down circuit 140 according to the resistance of the external resistor RO, the impedance of the first resistor unit 110, and the impedance of the second resistor unit 120.

The first control unit 130 may include a first comparator 131 and a first counter 132. The first comparator 131 may have a first input terminal connected to the first node N1 and a second input terminal connected to the second node N2. That is, the first comparator 131 may compare the voltage level of the first node N1 with the voltage level of the second node N2. The first counter 132 may output the first output signal OUT1 in response to an output signal of the first comparator 131. That is, the first counter 132 may generate and output the first output signal OUT1 for decreasing the impedance of the first pull-down circuit 140 if the voltage level of the first node N1 is greater than the voltage level of the second node N2. The first counter 132 may generate and output the first output signal OUT1 for increasing the impedance of the first pull-down circuit 140 if the voltage level of the first node N1 is less than the voltage level of the second node N2.

The first pull-down circuit 140 may be connected between the second node N2 and the first voltage source V1 and have the impedance that is determined in response to the first output signal OUT1. A method of determining the impedance of the first pull-down circuit 140 has been described above in detail, and thus a detailed explanation thereof will not be repeated here.

The second pull-down circuit 150 may be connected between a third node N3 and the first voltage source V1 and have an impedance that is determined in response to the first output signal OUT1. That is, since the second pull-down circuit 150 has the same configuration as that of the first pull-down circuit 140 and has the impedance that is determined in response to the first output signal OUT1, the impedance of the second pull-down circuit 150 may be the same as the impedance of the first pull-down circuit 140.

The second control unit 160 may output a second output signal OUT2 by using a voltage level of the third node N3 and a voltage level of a reference voltage VREF. The reference voltage VREF may have the voltage level that ranges between a voltage level of the first voltage source V1 and a voltage level of the second voltage source V2. For example, the reference voltage VREF may have the voltage level that is in the middle between voltage levels of the first voltage source V1 and the second voltage source V2. That is, the second control unit 160 may output the second output signal OUT2 that determines an impedance of the pull-up circuit 170 so that the voltage level of the third node N3 is the same as the voltage level of the reference voltage VREF. Since the reference voltage VREF has the voltage level that is in the middle between a voltage level of the first voltage source V1 and a voltage level of the second voltage source V2, the pull-up circuit 170 may have the impedance that is the same as the impedance of the second pull-down circuit 150 in response to the second output signal OUT2.

The second control unit 160 may include a second comparator 161 and a second counter 162. The second comparator 161 may have a first input terminal connected to the third node N3 and a second input terminal to which the reference voltage VREF is applied. That is, the second comparator 161 may compare the voltage level of the third node N3 with the voltage level of the reference voltage VREF. The second counter 162 may output the second output signal OUT2 in response to an output signal of the second comparator 161. That is, the second counter 162 may generate and output the second output signal OUT2 for increasing the impedance of the pull-up circuit 170 if the voltage level of the third node N3 is greater than the voltage level of the reference voltage VREF. The second counter may generate and output the second output signal OUT2 for decreasing the impedance of the pull-up circuit 170 if the voltage level of the third node N3 is less than the voltage level of the reference voltage VREF.

The pull-up circuit 170 may be connected between the third node N3 and the second voltage source V2 and have the impedance that is determined in response to the second output signal OUT2. A method of determining the impedance of the pull-up circuit 170 has been described above in detail, and thus a detailed explanation thereof will not be repeated here.

The terminating resistance of each of data input/output pads of a semiconductor device may be fixed by using the first output signal OUT1 and the second output signal OUT2. That is, the terminating resistance may be fixed when the first output signal OUT1 is applied to a pull-down circuit connected to each of the data input/output pads and the terminating resistance may be fixed when the second output signal OUT2 is applied to a pull-up circuit connected to each of the data input/output pads. In FIG. 1, since the voltage level of the first node N1 is fixed, a calibration operation may be performed irrespective of a capacitor component of the pad PAD. In FIG. 1, the terminating resistance may be fixed to a value that is the same as or different from the resistance of the external resistor RO.

Figure 2A:
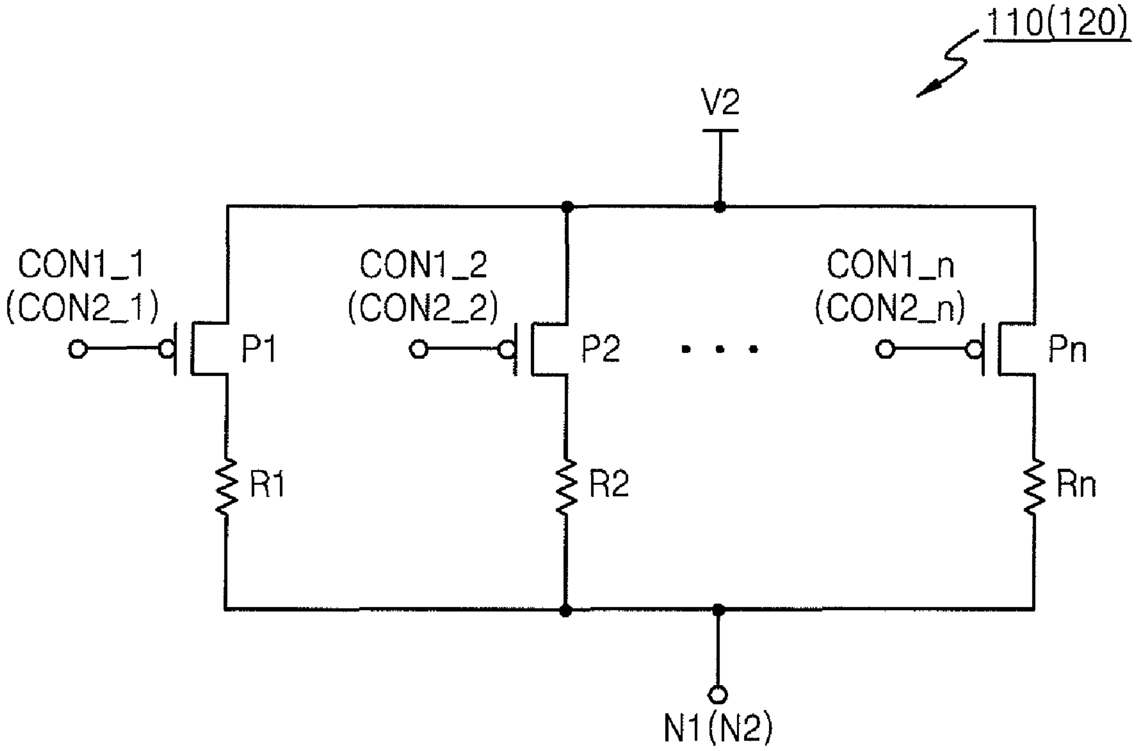
FIG. 2A is a circuit diagram illustrating a first resistor unit or a second resistor unit of the calibration circuit of FIG. 1 according to an embodiment of the inventive concept.

FIG. 2A is a circuit diagram illustrating the first resistor unit 110 or the second resistor unit 120 of the calibration circuit 100 of FIG. 1 according to an embodiment of the inventive concept.

Referring to FIGS. 1 and 2A, the first resistor unit 110 may include first through $n^{th}$ resistors R1, R2, . . . , and Rn (where n is a natural number) and first through $n^{th}$ switches P1, P2, . . . , and Pn. Each of the first through $n^{th}$ resistors R1, R2, . . . , and Rn may have one terminal connected to the first node N1 and the other terminal connected to a corresponding switch of the first through $n^{th}$ switches P1, P2, . . . , and Pn. Each of the first through $n^{th}$ switches P1, P2, . . . , and Pn may control whether to connect the second voltage source V2 to a corresponding resistor of the first through $n^{th}$ resistors R1, R2, . . . , and Rn in response to a corresponding bit of first through $n^{th}$ bits CON1_1, CON1_2, . . . , and CON1_n of the first control signal CON1.

The second resistor unit 120 may include first through $n^{th}$ resistors R1, R2, . . . , and Rn and first through $n^{th}$ switches R1, R2, . . . , and Rn, like the first resistor unit 110. Each of the first through $n^{th}$ resistors R1, R2, . . . , and Rn may have one terminal connected to the second node N2 and the other terminal connected to a corresponding switch of the first through $n^{th}$ switches P1, P2, . . . , and Pn. Each of the first through $n^{th}$ switches P1, P2, . . . , and Pn may control whether to connect the second voltage source V2 to a corresponding resistor of the first through $n^{th}$ resistors R1, R2, . . . , and Rn in response to a corresponding bit of first through $n^{th}$ bits CON2_1, CON2_2, . . . , and CON2_n of the second control signal CON2.

FIG. 2A illustrates a case where the first through $n^{th}$ switches P1, P2, . . . , and Pn are p-channel metal-oxide-semiconductor (PMOS) transistors. However, the present embodiment is not limited thereto, and another device may be used to control whether to connect the second voltage source V2 to a corresponding resistor of the first through $n^{th}$ resistors R1, R2, . . . , and Rn in response to the first control signal CON1 or the second control signal CON2.

Figure 2B:
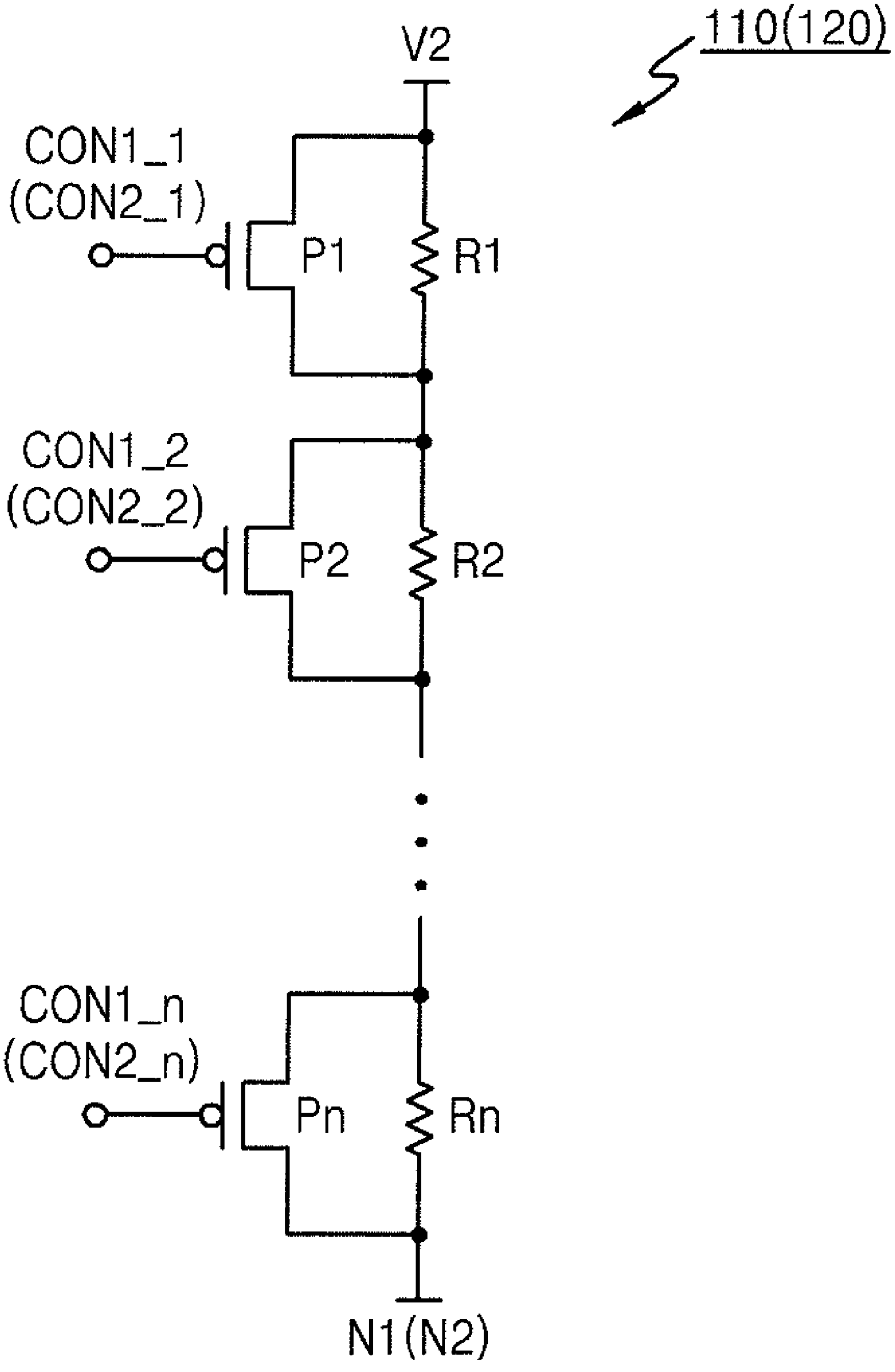
FIG. 2B is a circuit diagram illustrating the first resistor unit or the second resistor unit of the calibration circuit of FIG. 1 according to another embodiment of the inventive concept.

FIG. 2B is a circuit diagram illustrating the first resistor unit 110 or the second resistor unit 120 of the calibration circuit 100 of FIG. 1 according to another embodiment of the inventive concept.

Referring to FIGS. 1 and 2B, the first resistor unit 110 may include first through $n^{th}$ resistors R1, R2, . . . , and Rn (where n is a natural number) and first through $n^{th}$ switches P1, P2, . . . , and Pn. The first through $n^{th}$ resistors R1, R2, . . . , and Rn may be connected in series between the second voltage source V2 and the first node N1. Each of the first through $n^{th}$ switches P1, P2, . . . , and Pn connected between both terminals of a corresponding resistor of the first through $n^{th}$ resistors R1, R2, . . . , and Rn may be closed to create a short-circuit or may be opened in response to a corresponding bit of first through $n^{th}$ bits CON1_1, CON1_2, . . . , and CON1_n of the first control signal CON1.

The second resistor unit 120 may include first through $n^{th}$ resistors R1, R2, . . . , and Rn and first through $n^{th}$ switches P1, P2, . . . , and Pn, like the first resistor unit 110. The first through $n^{th}$ resistors R1, R2, . . . , and Rn may be connected in series between the second voltage source V2 and the second node N2. Each of the first through $n^{th}$ switches P1, P2, . . . , and Pn connected between both terminals of a corresponding resistor of the first through $n^{th}$ resistors R1, R2, . . . , and Rn may be closed to create a short-circuit or may be opened in response to a corresponding bit of first through $n^{th}$ CON2_1, CON2_2, . . . , and CON2_n of the second control signal CON2.

FIG. 2B illustrates a state that the first through $n^{th}$ switches P1, P2, . . . , and Pn are PMOS transistors. However, the present embodiment is not limited thereto, and the first through $n^{th}$ switches P1, P2, . . . , and Pn may be other devices.

Figure 2C:
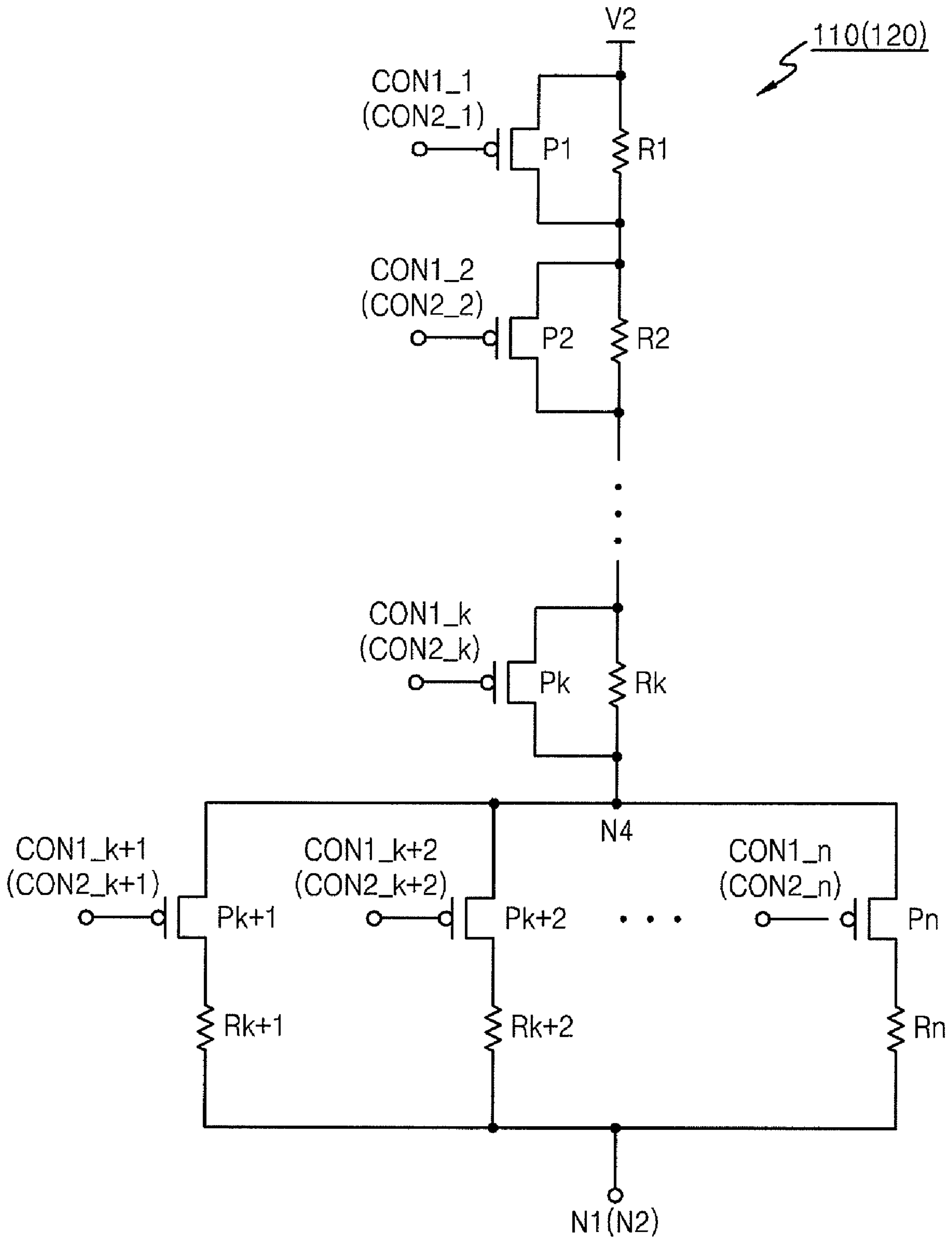
FIG. 2C is a circuit diagram illustrating the first resistor unit or the second resistor unit of the calibration circuit of FIG. 1 according to another embodiment of the inventive concept.

FIG. 2C is a circuit diagram illustrating the first resistor unit 110 or the second resistor unit 120 of the calibration circuit 100 of FIG. 1 according to another embodiment of the inventive concept.

Referring to FIGS. 1 and 2C, the first resistor unit 110 may include first through $n^{th}$ resistors R1, R2, . . . , and Rn (where n is a natural number) and first through $n^{th}$ switches P1, P2, . . . , and Pn. The first through $k^{th}$ resistors R1, R2, . . . , and Rk (where k is a natural number greater than 1 and less than n) may be connected in series between the second voltage source V2 and a fourth node N4, and each of the $k+1^{th}$ through $n^{th}$ resistors Rk+1, Rk+2, . . . , and Rn may have one terminal connected to the first node N1 and the other terminal connected to a corresponding switch of the $k+1^{th}$ through $n^{th}$ switches Pk+1, Pk+2, . . . , and Pn. Each of the first through $k^{th}$ switches P1, P2, . . . , and Pk connected between both terminals of a corresponding resistor of the first through $k^{th}$ resistors R1, R2, . . . , and Rk may be closed to create a short-circuit or may be opened in response to a corresponding bit of first through $k^{th}$ bits CON1_1, CON1_2, . . . , and CON1_k of the first control signal CON1. Each of the $k+1^{th}$ through $n^{th}$ switches Pk+1, Pk+2, . . . , and Pn may control whether to connect the fourth node N4 to a corresponding resistor of the $k+1^{th}$ through $n^{th}$ resistors Rk+1, Rk+2, . . . , and Rn in response to a corresponding bit of k+1 through $n^{th}$ bits CON1_k+1, CON1_k+2, . . . , and CON1_n of the first control signal CON1.

The second resistor unit 120 may include first through $n^{th}$ resistors R1, R2, . . . , and Rn and first through $n^{th}$ switches P1, P2, . . . , and Pn. The first through $k^{th}$ resistors R1, R2, . . . , and Rk may be connected in series between the second voltage source V2 and the fourth node N4, and each of the $k+1^{th}$ through $n^{th}$ resistors Rk+1, Rk+2, . . . , and Rn may have one terminal connected to the second node N2 and the other terminal connected to a corresponding switch of $k+1^{th}$ through $n^{th}$ switches Pk+1, Pk+2, . . . , and Pn. Each of the first through $k^{th}$ switches P1, P2, . . . , Pk connected between both terminals of a corresponding resistor of the first through $k^{th}$ resistors R1, R2, . . . , Rk may be closed to create a short-circuit or opened in response to a corresponding bit of first through $k^{th}$ bits CON2_1, CON2_2, . . . , CON2_k of the second control signal CON2. Each of the $k+1^{th}$ through $n^{th}$ switches Pk+1, Pk+2, . . . , and Pn may control whether to connect the fourth node N4 to a corresponding resistor of the $k+1^{th}$ through $n^{th}$ resistors Rk+1, Rk+2, . . . , and Rn in response to a corresponding bit of $k+1^{th}$ through $n^{th}$ bits CON2_k+1, CON2_k+2, . . . , and CON2_n of the second control signal CON2.

FIG. 2C illustrates a combination of FIGS. 2A and 2B. In FIG. 2C, the first through $n^{th}$ switches P1, P2, . . . , and Pn are PMOS transistors. However, the present embodiment is not limited thereto, and another device may be used as described with reference to FIGS. 2A and 2B.

Figure 3:
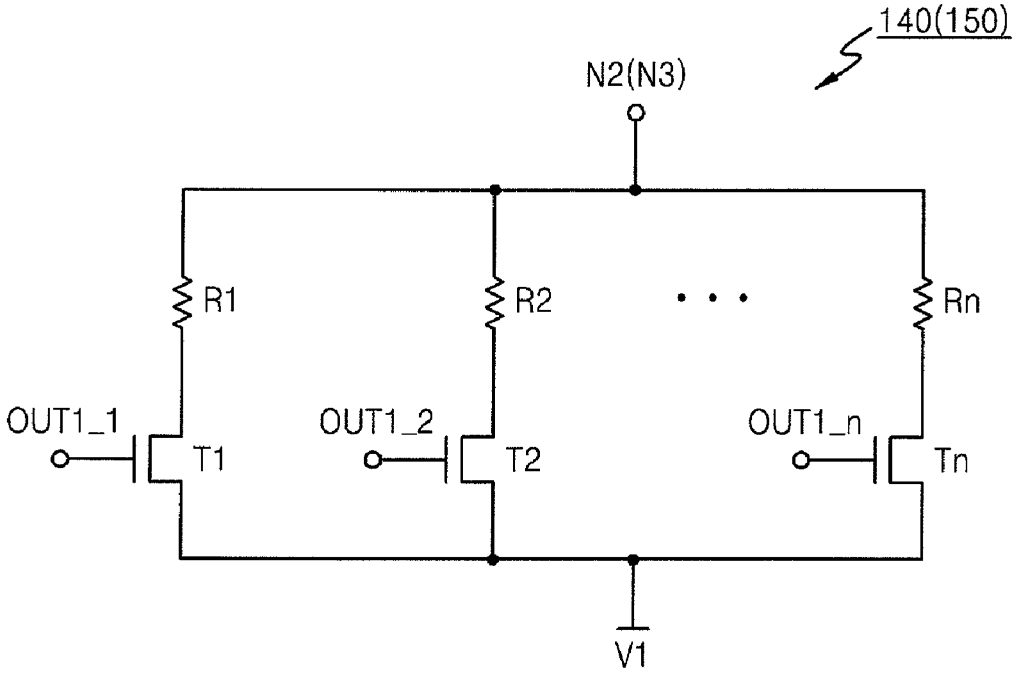
FIG. 3 is a circuit diagram illustrating a first pull-down circuit or a second pull-down circuit of the calibration circuit of FIG. 1 according to an embodiment of the inventive concept.

FIG. 3 is a circuit diagram illustrating the first pull-down circuit 140 or the second pull-down circuit 150 of the calibration circuit 100 of FIG. 1 according to an embodiment of the inventive concept.

Referring to FIGS. 1 and 3, the first pull-down circuit 140 may include first through $n^{th}$ resistors R1, R2, . . . , and Rn (where n is a natural number) and first through $n^{th}$ switches T1, T2, . . . , and Tn. Each of the first through $n^{th}$ resistors R1, R2, . . . , and Rn may have one terminal connected to the second node N2 and the other terminal connected to a corresponding switch of first through $n^{th}$ switches T1, T2, . . . , and Tn. Each of the first through $n^{th}$ switches T1, T2, . . . , and Tn may control whether to connect the first voltage source V1 to a corresponding resistor of the first through $n^{th}$ resistors R1, R2, . . . , and Rn in response to a corresponding bit of first through $n^{th}$ bits OUT1_1, OUT1_2, . . . , and OUT1_n of the first output signal OUT1.

The second pull-down circuit 150 may include first through $n^{th}$ resistors R1, R2, . . . , and Rn (where n is a natural number) and first through $n^{th}$ switches T1, T2, . . . , and Tn, like the first pull-down circuit 140. Each of the first through $n^{th}$ resistors R1, R2, . . . , and Rn may have one terminal connected to the third node N3 and the other terminal connected to a corresponding switch of the first through $n^{th}$ switches T1, T2, . . . , and Tn. Each of the first through $n^{th}$ switches T1, T2, . . . , and Tn may control whether to connect the first voltage source V1 to a corresponding resistor of the first through $n^{th}$ resistors R1, R2, . . . , and Rn in response to a corresponding bit of first through $n^{th}$ bits OUT1_1, OUT1_2, . . . , and OUT1_n of the first output bit OUT1.

FIG. 3 illustrates a case where the first through $n^{th}$ switches T1, T2, . . . , and Tn are n-channel metal-oxide-semiconductor (NMOS) transistors. However, the present embodiment is not limited thereto, and another device may be used to control whether to connect the first voltage source V1 to a corresponding resistor of the first through $n^{th}$ resistors R1, R2, . . . , and Rn in response to the first output signal OUT1. The first through $n^{th}$ resistors R1, R2, . . . , and Rn and the first through $n^{th}$ switches T1, T2, . . . , and Tn of the first pull-down circuit 140 and the second pull-down circuit 150 may be arranged in the same manner as the first through resistors R1, R2, . . . , and Rn and the first through $n^{th}$ switches P1, P2, . . . , and Pn illustrated in FIG. 2B or 2C.

Figure 4:
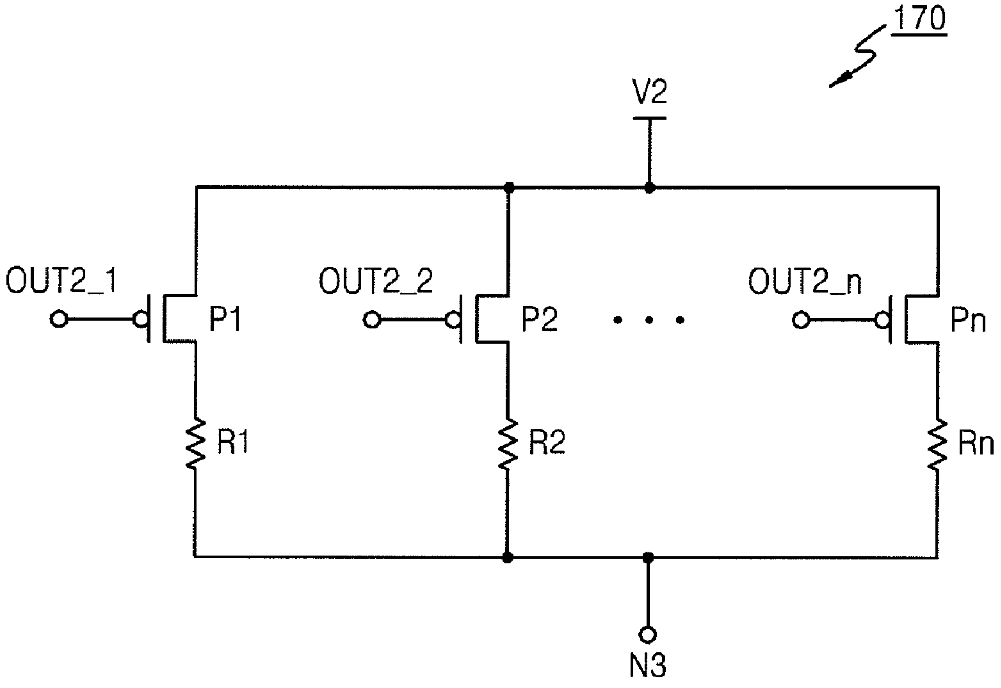
FIG. 4 is a circuit diagram illustrating a pull-up circuit of the calibration circuit of FIG. 1 according to an embodiment of the inventive concept.

FIG. 4 is a circuit diagram illustrating the pull-up circuit 170 of the calibration circuit 100 of FIG. 1 according to an embodiment of the inventive concept.

Referring to FIGS. 1 and 4, the pull-up circuit 170 may include first through $n^{th}$ resistors R1, R2, . . . , and Rn (where n is a natural number) and first through $n^{th}$ switches P1, P2, . . . , and Pn. Each of the first through $n^{th}$ resistors R1, R2, . . . , and Rn may have one terminal connected to the third node N3 and the other terminal connected to a corresponding switch of the first through $n^{th}$ switches P1, P2, . . . , and Pn. Each of the first through $n^{th}$ switches P1, P2, . . . , and Pn may control whether to connect the second voltage source V2 to a corresponding resistor of the first through $n^{th}$ resistors R1, R2, . . . , and Rn in response to a corresponding bit of first through $n^{th}$ bits OUT2_1, OUT2_2, . . . , and OUT2_n of the second output signal OUT2.

FIG. 4 illustrates a case where the first through $n^{th}$ switches P1, P2, . . . , and Pn are PMOS transistors. However, the present embodiment is not limited thereto, and another device may be used to control whether to connect the second voltage source V2 to a corresponding resistor of the first through $n^{th}$ resistors R1, R2, . . . , and Rn in response to the second output signal OUT2. The first through $n^{th}$ resistors R1, R2, . . . , and Rn and the first through $n^{th}$ switches P1, P2, . . . , and Pn of the first pull-down circuit 140 and the second pull-down circuit 150 may be arranged in the same manner as the first through $n^{th}$ resistors R1, R2, . . . , and Rn and the first through $n^{th}$ switches P1, P2, . . . , and Pn illustrated in FIG. 2B or 2C.

Figure 5:
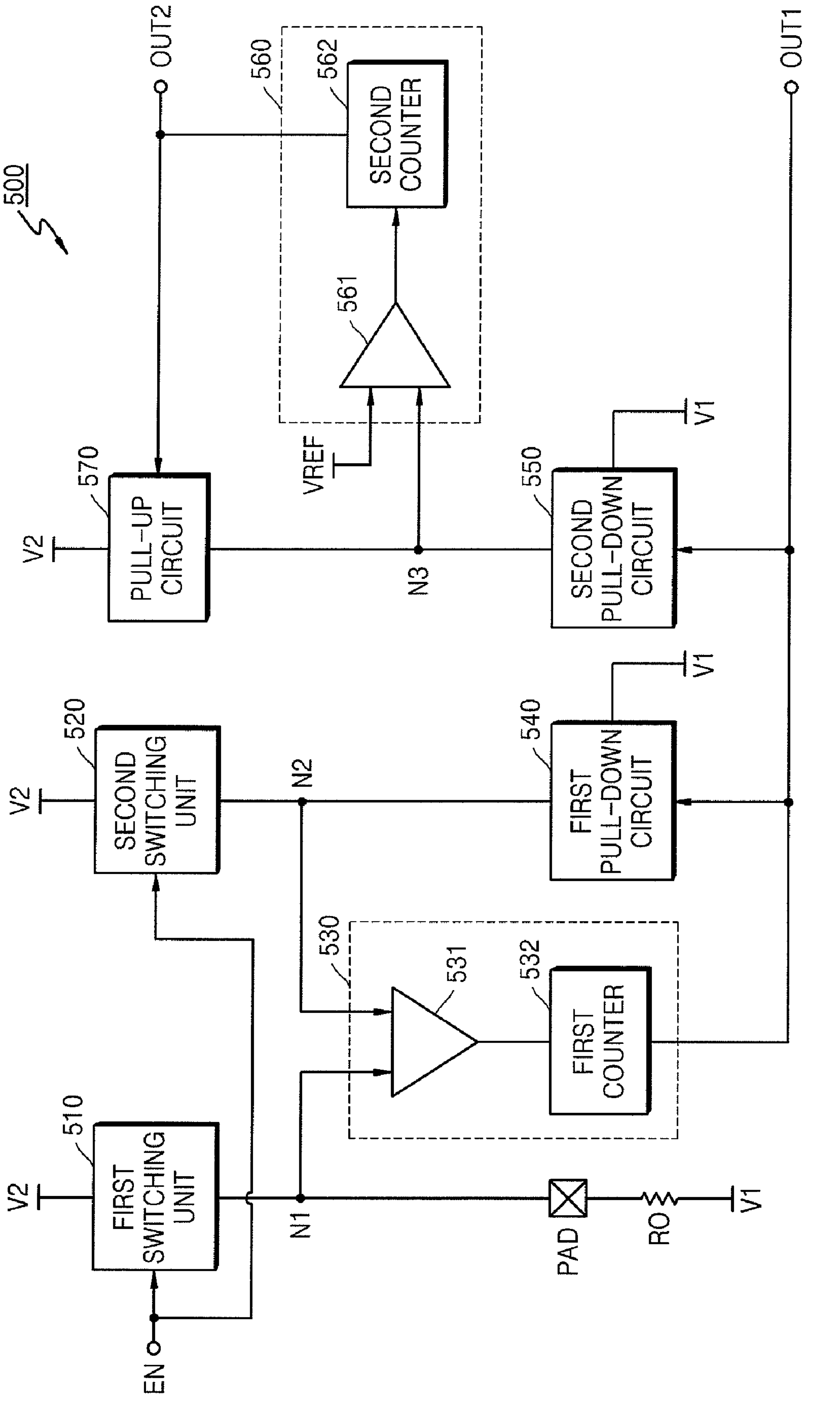
FIG. 5 is a block diagram of a calibration circuit according to another embodiment of the inventive concept.

FIG. 5 is a block diagram of a calibration circuit 500 according to another embodiment of the inventive concept.

Referring to FIGS. 1 and 5, the calibration circuit 500 may include a pad PAD, a first control unit 530, a first pull-down circuit 540, a second pull-down circuit 550, a second control unit 560, and a pull-up circuit 570. When the calibration circuit 500 of FIG. 5 is compared with the calibration circuit 100 of FIG. 1, the pad PAD, the first control unit 530, the first pull-down circuit 540, the second pull-down circuit 550, the second control unit 560, and the pull-up circuit 570 of the calibration circuit 500 of FIG. 5 respectively correspond to the pad PAD, the first control unit 130, the first pull-down circuit 140, the second pull-down circuit 150, the second control unit 160, and the pull-up circuit 170 of the calibration circuit 100 of FIG. 1, and a detailed explanation thereof in terms of configuration and operation will not be given here.

The calibration circuit 500 of FIG. 5 may include a first switching unit 510 and a second switching unit 520 instead of the first resistor unit 110 and the second resistor unit 120 of the calibration circuit 100 of FIG. 1. The first switching unit 510 may control whether to connect the second voltage source V2 to the first node N1 in response to an enable signal EN. The second switching unit 520 may control whether to connect the second voltage source V2 to the second node N2 in response to the enable signal EN. That is, the first switching unit 510 and the second switching unit 520 may control whether to connect the second voltage source V2 to the first node N1 or the second node N2 having the same impedance, unlike the calibration circuit 100 of FIG. 1 in which the first resistor unit 110 and the second resistor unit 120 have impedances that are independent from each other. For example, if the calibration circuit 500 performs a calibration operation, the first switching unit 510 may connect the second voltage source V2 to the first node N1 in response to the enable signal EN, and the second switching unit 510 may connect the second voltage source V2 to the second node N2 in response to the enable signal EN. If the calibration circuit 500 does not perform a calibration operation, the first switching unit 510 may cut off the connection between the second voltage source V2 and the first node N1 in response to the enable signal EN, and the second switching unit 510 may cut off the connection between the second voltage source V2 and the second node N2 in response to the enable signal EN.

The calibration circuit 500 of FIG. 5 may perform a calibration operation irrespective of a capacitor component of the pad PAD since the voltage level of the first node N1 is fixed, like in FIG. 1. That is, the calibration circuit 500 may be used when the terminating resistance needs to be fixed to the same value as the resistance of the external resistor RO.

Figure 6A:
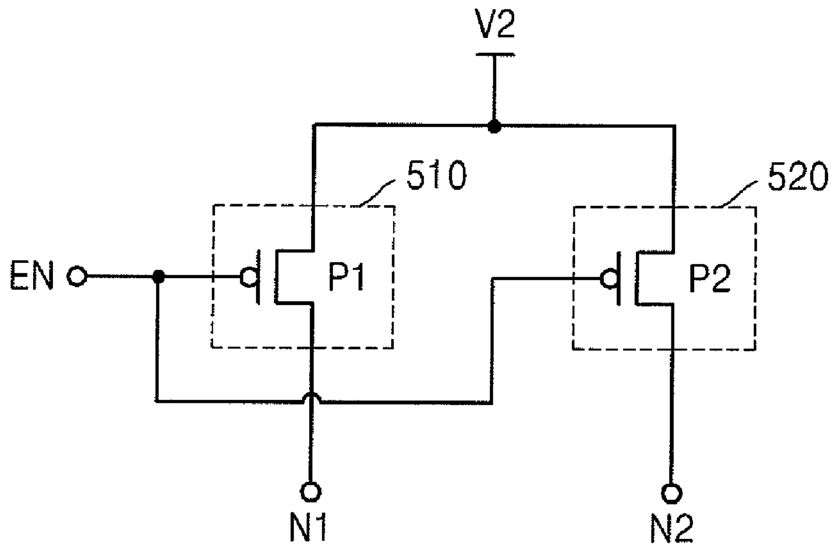
FIG. 6A is a circuit diagram illustrating a first switching unit and a second switching unit of the calibration circuit of FIG. 5 according to an embodiment of the inventive concept.

FIG. 6A is a circuit diagram illustrating the first switching unit 510 and the second switching unit 520 of the calibration circuit 500 of FIG. 5 according to an embodiment of the inventive concept.

Referring to FIGS. 5 and 6A, the first switching unit 510 may include a first switch P1, and the second switching unit 520 may include a second switch P2. The first switch P1 may be a PMOS transistor having a first terminal connected to the second voltage source V2, a second terminal connected to the first node N1, and a gate to which the enable signal EN is applied. The second switch P2 may be a PMOS transistor having a first terminal connected to the second voltage source V2, a second terminal connected to the second node N2, and a gate to which the enable signal EN is applied.

In FIG. 6A, the first and second switches P1 and P2 are PMOS transistors. However, the present embodiment is not limited thereto, and another device may be used to control whether to connect the second voltage source V2 to the first node N1 or the second node N2 in response to the enable signal EN.

Figure 6B:
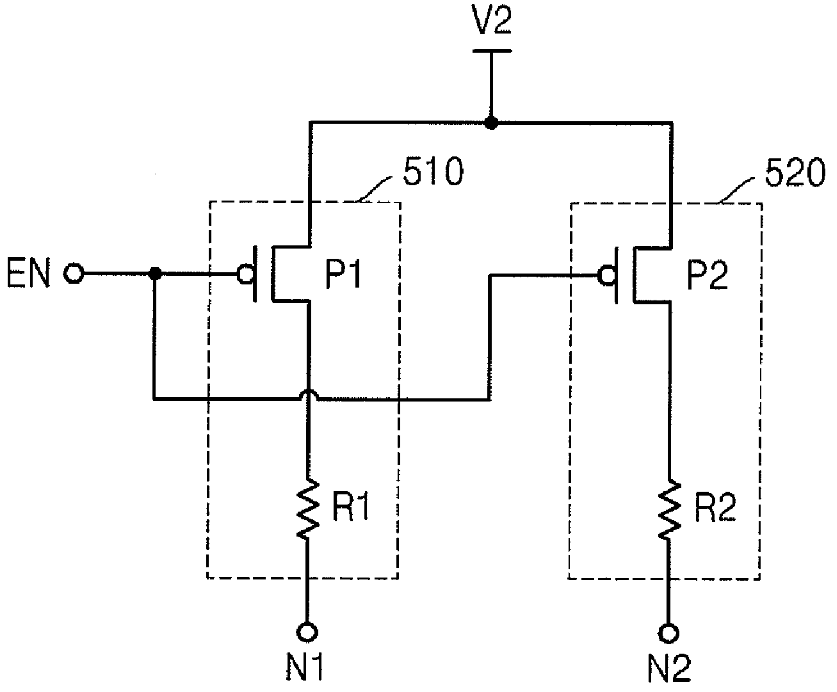
FIG. 6B is a circuit diagram illustrating the first switching unit and the second switching unit of the calibration circuit of FIG. 5 according to another embodiment of the inventive concept.

FIG. 6B is a circuit diagram illustrating the first switching unit 510 and the second switching unit 520 of the calibration circuit 500 of FIG. 5 according to another embodiment of the inventive concept.

Referring to FIGS. 5 and 6B, the first switching unit 510 may include a first switch P1 and a first resistor R1, and the second switching unit 520 may include a second switch P2 and a second resistor R2. The first resistor R1 may have one terminal connected to the first node N1 and the other terminal connected to the first switch P1. The second resistor R2 may have one terminal connected to the second node N2 and the other terminal connected to the second switch P2. The first switch P1 may control whether to connect the second voltage source V2 to the first resistor R1 in response to the enable signal EN. The second switch P2 may control whether to connect the second voltage source V2 to the second resistor R2 in response to the enable signal EN.

In FIG. 6B, the first and second switches P1 and P2 are PMOS transistors. However, the present embodiment is not limited thereto, and another device may be used to control whether to connect the second voltage source V2 to the first resistor R1 or the second resistor R2 in response to the enable signal EN.

Figure 7:
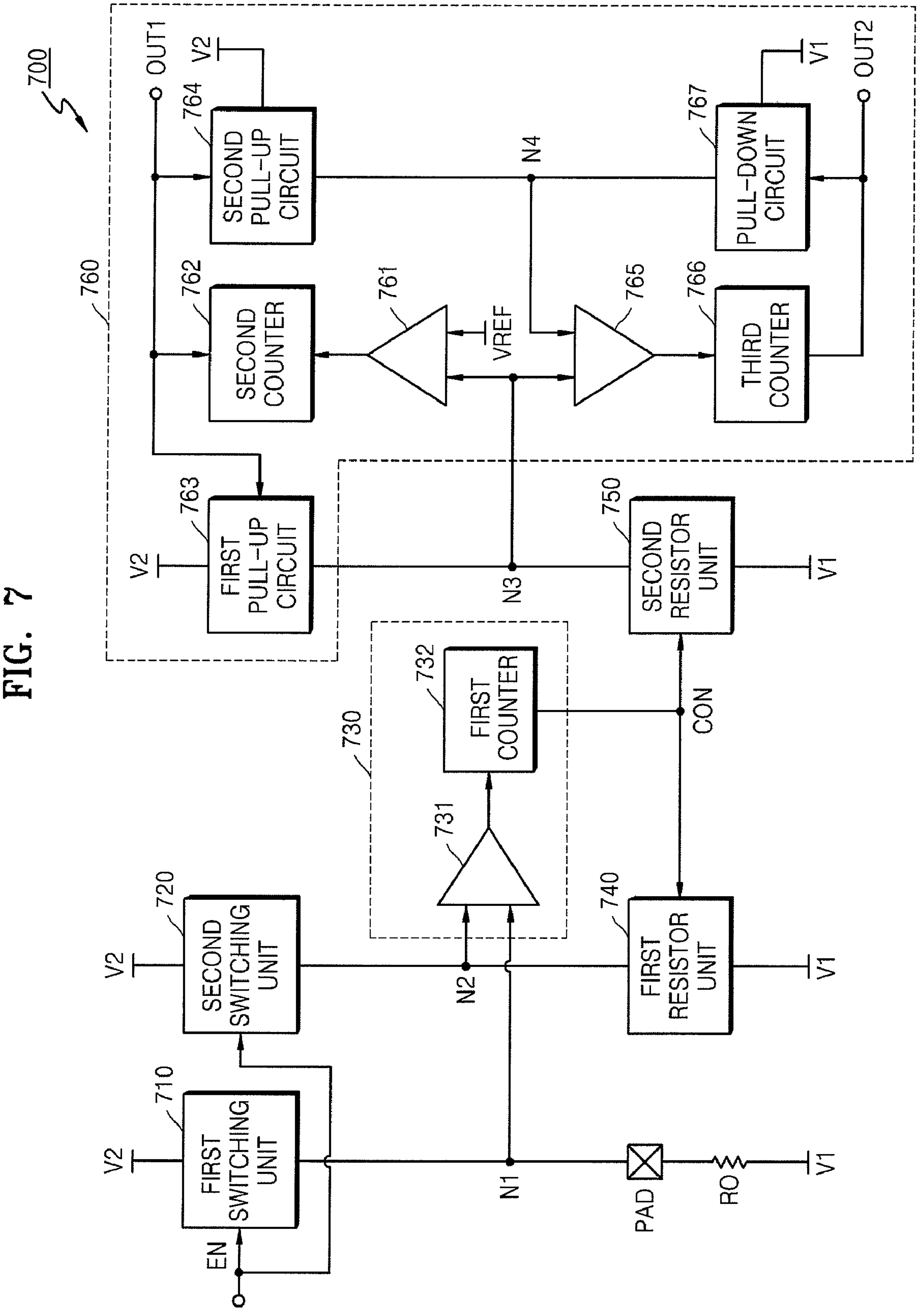
FIG. 7 is a block diagram of a calibration circuit according to another embodiment of the inventive concept.

FIG. 7 is a block diagram of a calibration circuit 700 according to another embodiment of the inventive concept.

Referring to FIG. 7, the calibration circuit 700 may include a pad PAD, a first control unit 730, a first resistor unit 740, a second resistor unit 750, and a calibration unit 760.

The pad PAD may be connected to an external resistor RO connected to a first voltage source V1 and a first node N1. The first voltage source V1 may be a voltage source that supplies a ground voltage.

The first control unit 730 may generate and output a control signal CON by using a voltage level of the first node N1 and a voltage level of a second node N2. That is, the first control unit 730 may generate and output the control signal CON that determines an impedance of the first resistor unit 740 so that the voltage level of the first node N1 is the same as the voltage level of the second node N2. For example, if a resistance of the external resistor RO is 240Ω, the impedance of the first resistor unit 740 may be determined to be 240Ω in response to the control signal CON. That is, the first control unit 730 may output the control signal CON that determines the impedance of the first resistor unit 740 according to the resistance of the external resistor RO.

The first control unit 730 may include a first comparator 731 and a first counter 732. The first comparator 731 may have a first input terminal connected to the first node N1 and a second input terminal connected to the second node N2. That is, the first comparator 731 may compare the voltage level of the first node N1 with the voltage level of the second node N2. The first counter 732 may output the control signal CON in response to an output signal of the first comparator 731. That is, the first counter 732 may output the control signal CON that decreases the impedance of the first resistor unit 740 if the voltage level of the second node N2 is greater than the voltage level of the first node N1. The first counter 732 may output the control signal CON for increasing the impedance of the first resistor unit 740 if the voltage level of the second node N2 is less than the voltage level of the first node N1.

The first resistor unit 740 may be connected between the second node N2 and the first voltage source V1 and have the impedance that is determined in response to the control signal CON. A method of determining the impedance of the first resistor unit 740 has been described above in detail, and thus a detailed explanation thereof will not be repeated here.

The second resistor unit 750 may be connected between a third node N3 and the first voltage source V1 and have an impedance that is determined in response to the control signal CON. That is, since the second resistor unit 750 has the same configuration as that of the first resistor unit 740 and has the impedance that is determined in response to the control signal CON, the impedance of the second resistor unit 750 may be the same as the impedance of the first resistor unit 740.

The calibration unit 760 may perform a calibration operation by using a voltage level of the third node N3. The calibration unit 760 may include a second comparator 761, a second counter 762, a first pull-up circuit 763, a second pull-up circuit 764, a third comparator 765, a third counter 766, and a pull-down circuit 767.

The second comparator 761 may have a first input terminal connected to the third node N3 and a second input terminal to which a reference voltage VREF is applied. That is, the second comparator 761 may compare the voltage level of the third node N3 with a voltage level of the reference voltage VREF. The second counter 762 may output a first output signal OUT1 in response to an output signal of the second comparator 761. That is, the second counter 762 may output the first output signal OUT1 for increasing an impedance of the first pull-up circuit 763 if the voltage level of the third node N3 is greater than the voltage level of the reference voltage VREF. The second counter 762 may output the first output signal OUT1 for decreasing the impedance of the first pull-up circuit 763 if the voltage level of the third node N3 is less than the voltage level of the reference voltage VREF. Since the reference voltage VREF has the voltage level that is in the middle between a voltage level of the first voltage source V1 and a voltage level of a second voltage source V2, the first pull-up circuit 763 may have the same impedance as the impedance of the second resistor unit 750 in response to the first output signal OUT1.

The first pull-up circuit 763 may be connected between the third node N3 and the second voltage source V2 and have the impedance that is determined in response to the first output signal OUT1. A method of determining the impedance of the first pull-up circuit 763 has been described above in detail, and thus a detailed explanation thereof will not be repeated here.

The second pull-up circuit 764 may be connected between a fourth node N4 and the second voltage source V2 and have an impedance that is determined in response to the first output signal OUT1. That is, since the second pull-up circuit 764 has the same configuration as that of the first pull-up circuit 763 and has the impedance that is determined in response to the first output signal OUT1, the impedance of the second pull-up circuit 764 may be the same as the impedance of the first pull-up circuit 763.

The third comparator 765 may have a first input terminal connected to the third node N3 and a second input terminal connected to the fourth node N4. That is, the third comparator 765 may compare the voltage level of the third node N3 with a voltage level of the fourth node N4. The third counter 766 may output a second output signal OUT2 in response to an output signal of the third comparator 765. That is, the third counter 766 may output the second output signal OUT2 for decreasing an impedance of the pull-down circuit 767 if the voltage level of the fourth node N4 is greater than the voltage level of the third node N3. The third counter 766 may output the second output signal for increasing the impedance of the pull-down circuit 767 if the voltage level of the fourth node N4 is less than the voltage level of the third node N3.

The pull-down circuit 767 may be connected between the fourth node N4 and the first voltage source V1 and have the impedance that is determined in response to the second output signal OUT2. A method of determining the impedance of the pull-down circuit 767 has been described above in detail, and thus a detailed explanation thereof will not be repeated here.

The terminating resistance of each of data input/output pads of a semiconductor device may be fixed by using the first output signal OUT1 and the second output signal OUT2. That is, the terminating resistance may be fixed when the first output signal OUT1 is applied to a pull-up circuit connected to each of the data input/output pads, and the terminating resistance may be fixed when the second output signal OUT2 is applied to a pull-down circuit connected to each of the data input/output pads. In FIG. 7, since the voltage level of the third node N3 is fixed, a calibration operation may be performed irrespective of a capacitor component of the pad PAD.

The calibration circuit 700 may further include a first switching unit 710 and a second switching unit 720, like the calibration circuit 500 of FIG. 5. The first switching unit 710 may control whether to connect the second voltage source V2 to the first node N1 in response to an enable signal EN. The second switching unit 720 may control whether to connect the second voltage source V2 to the second node N2 in response to the enable signal EN. The first switching unit 710 and the second switching unit 720 are similar to the first switching unit 510 and the second switching unit 520 in terms of configuration and operation, and thus a detailed explanation thereof will not be given here.

Figure 8A:
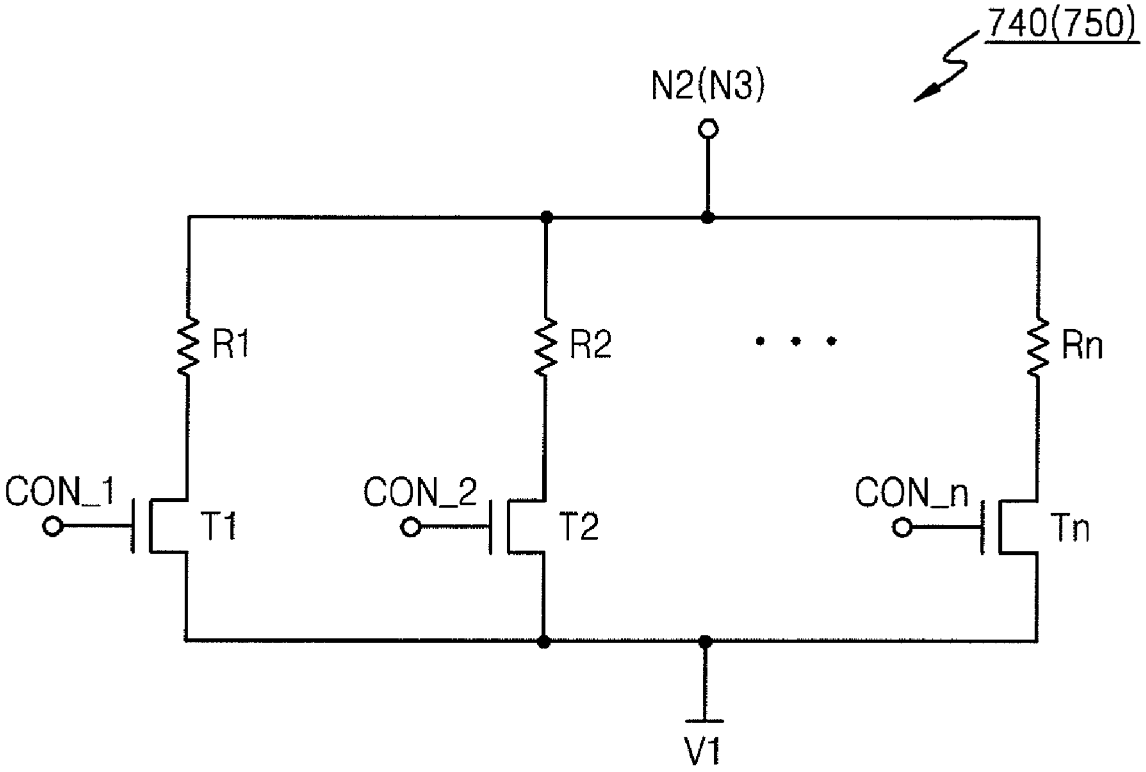
FIG. 8A is a circuit diagram illustrating a first resistor unit or a second resistor unit of the calibration circuit of FIG. 7 according to an embodiment of the inventive concept.

FIG. 8A is a circuit diagram illustrating the first resistor unit 740 or the second resistor unit 750 of the calibration circuit 700 of FIG. 7 according to an embodiment of the inventive concept.

Referring to FIGS. 7 and 8A, the first resistor unit 740 may include first through $n^{th}$ resistors R1, R2, . . . , and Rn (where n is a natural number) and first through $n^{th}$ switches T1, T2, . . . , and Tn. Each of the first through $n^{th}$ resistors R1, R2, . . . , and Rn may have one terminal connected to the second node N2 and the other terminal connected to a corresponding switch of the first through $n^{th}$ switches T1, T2, . . . , and Tn. Each of the first through $n^{th}$ switches T1, T2, . . . , and Tn may control whether to connect the first voltage source V1 to a corresponding resistor of the first through $n^{th}$ resistors R1, R2, . . . , and Rn in response to a corresponding bit of first through $n^{th}$ bits CON_1, CON_2, . . . , and CON_n of the control signal CON.

The second resistor unit 750 may include first through $n^{th}$ resistors R1, R2, . . . , and Rn and first through $n^{th}$ switches T1, T2, . . . , and Tn, like the first resistor unit 740. Each of the first through $n^{th}$ resistors R1, R2, . . . , and Rn may have one terminal connected to the third node N3 and the other terminal connected to a corresponding switch of the first through $n^{th}$ switches T1, T2, . . . , and Tn. Each of the first through $n^{th}$ switches T1, T2, . . . , and Tn may control whether to connect the first voltage source V1 to a corresponding resistor of the first through $n^{th}$ resistors R1, R2, . . . , and Rn in response to a corresponding bit of first through $n^{th}$ bits CON_1, CON_2, . . . , and CON_n of the control signal CON.

In FIG. 8A, the first through $n^{th}$ switches T1, T2, . . . , and Tn are NMOS transistors. However, the present embodiment is not limited thereto, and another device may be used to control whether to connect the first voltage source V1 to a corresponding resistor of the first through $n^{th}$ resistors R1, R2, . . . , and Rn in response to the control signal CON.

Figure 8B:
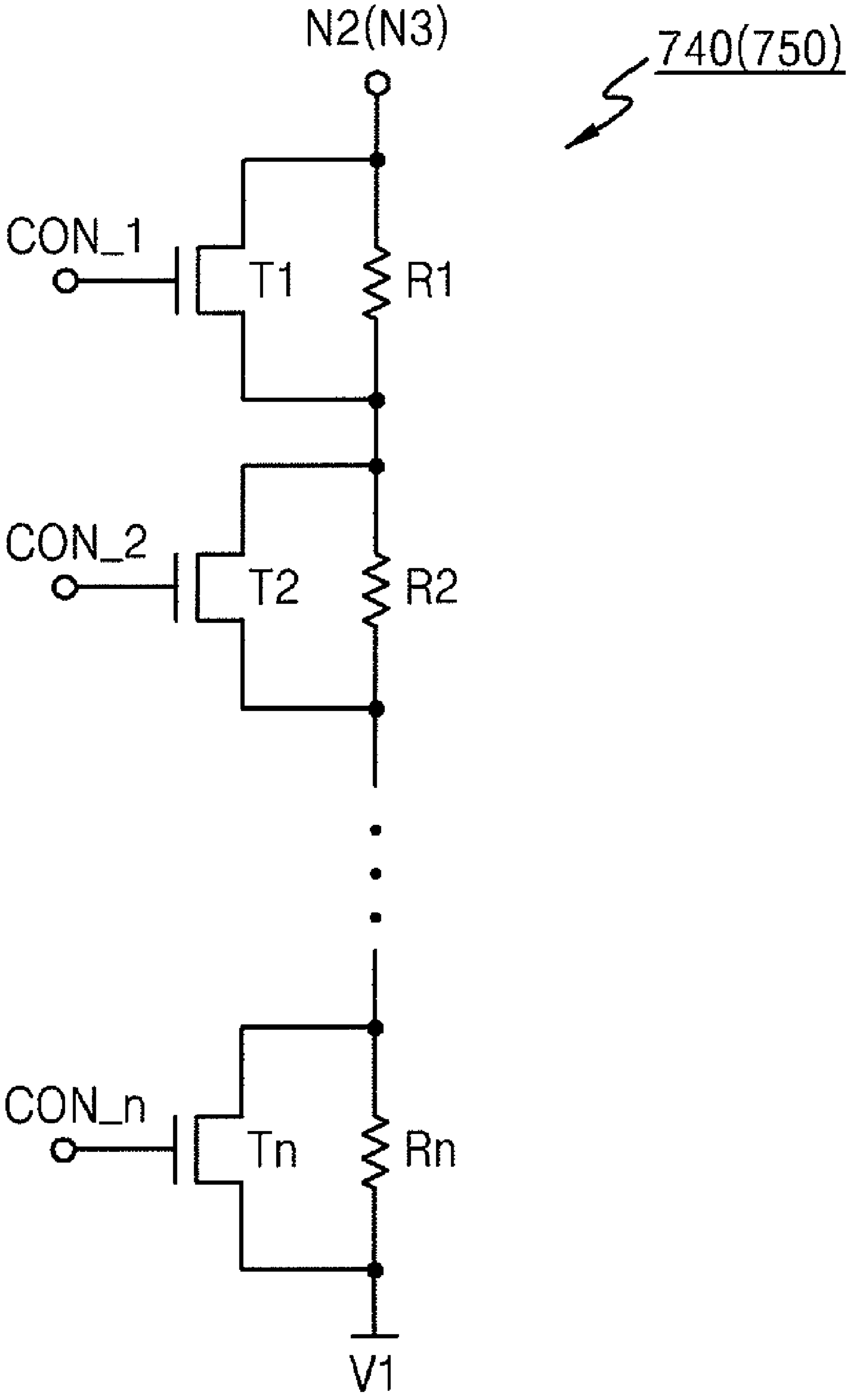
FIG. 8B is a circuit diagram illustrating the first resistor unit or the second resistor unit of the calibration circuit of FIG. 7 according to another embodiment of the inventive concept.

FIG. 8B is a circuit diagram illustrating the first resistor unit 740 or the second resistor unit 750 of the calibration circuit 700 of FIG. 7 according to another embodiment of the inventive concept.

Referring to FIGS. 7 and 8B, the first resistor unit 740 may include first through $n^{th}$ resistors R1, R2, . . . , and Rn (where n is a natural number) and first through $n^{th}$ switches T1, T2, . . . , and Tn. The first through $n^{th}$ resistors R1, R2, . . . , and Rn may be connected in series between the first voltage source V1 and the second node N2. Each of the first through $n^{th}$ switches T1, T2, . . . , and Tn connected between both terminals of a corresponding resistor of the first through $n^{th}$ resistors R1, R2, . . . , and Rn may be closed to create a short-circuit or may be opened in response to a corresponding bit of first through $n^{th}$ bits CON_1, CON_2, . . . , and CON_n of the control signal CON.

The second resistor unit 750 may include first through $n^{th}$ resistors R1, R2, . . . , and Rn and first through $n^{th}$ switches T1, T2, . . . , and Tn like the first resistor unit 740. The first through $n^{th}$ resistors R1, R2, . . . , and Rn are connected in series between the first voltage source V1 and the third node N3. Each of the first through $n^{th}$ switches T1, T2, . . . , and Tn connected between both terminals of a corresponding resistor of the first through $n^{th}$ resistors R1, R2, . . . , and Rn may be closed to create a short-circuit or may be opened in response to a corresponding bit of first through $n^{th}$ bits CON_1, CON_2, . . . , and CON_n of the control signal CON.

In FIG. 8B, the first through $n^{th}$ switches T1, T2, . . . , and Tn are NMOS transistors. However, the present embodiment is not limited thereto, and the first through $n^{th}$ switches T1, T2, . . . , and Tn may be other devices.

Figure 8C:
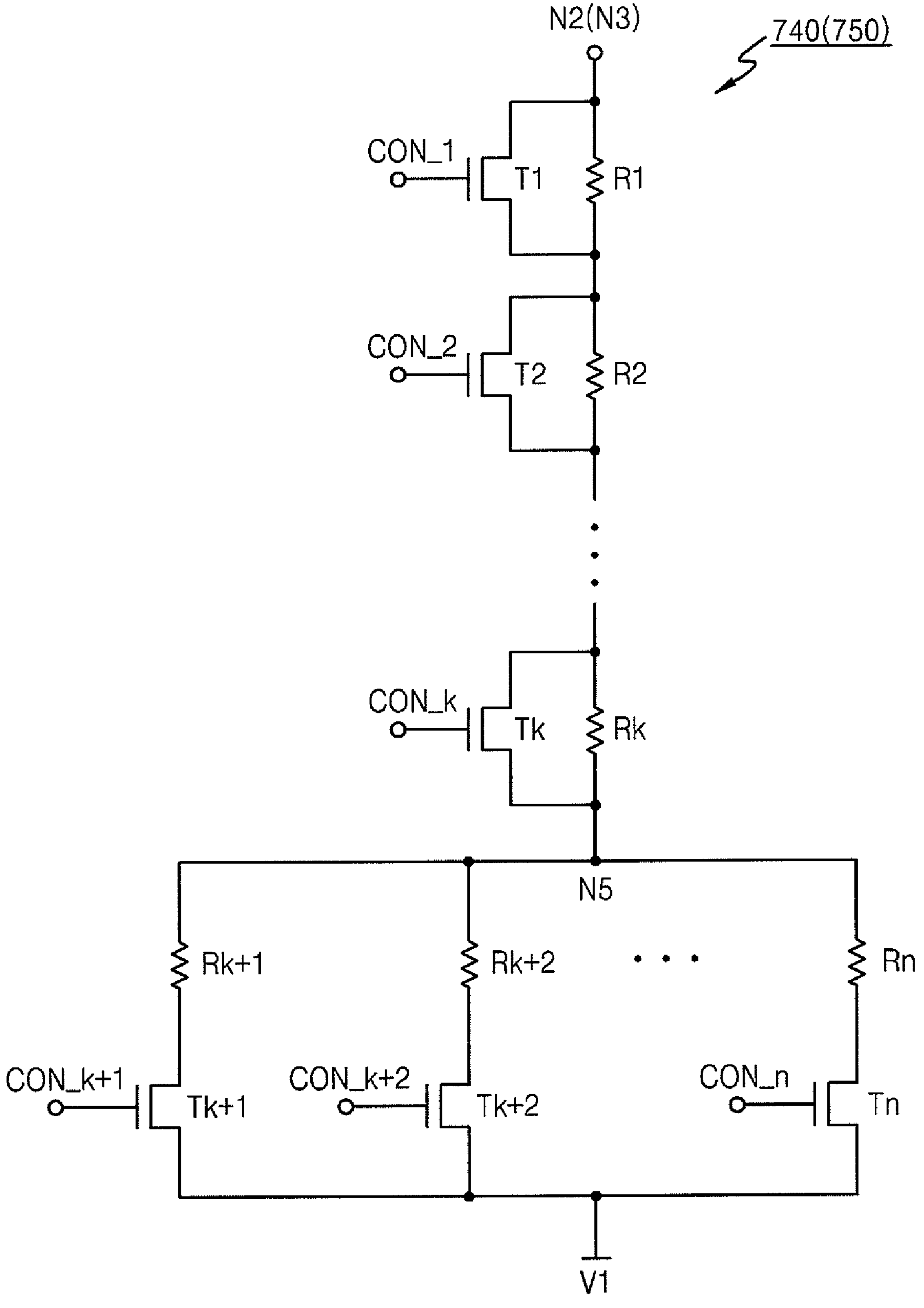
FIG. 8C is a circuit diagram illustrating the first resistor unit or the second resistor unit of the calibration circuit of FIG. 7 according to another embodiment of the inventive concept.

FIG. 8C is a circuit diagram illustrating the first resistor unit 740 or the second resistor unit 750 of the calibration circuit 700 of FIG. 7 according to another embodiment of the inventive concept.

Referring to FIGS. 7 and 8C, the first resistor unit 740 may include first through $n^{th}$ resistors R1, R2, . . . , and Rn (where n is a natural number) and first through $n^{th}$ T1, T2, . . . , and Tn. The first through $k^{th}$ resistors (where k is a natural number greater than 1 and less than n) may be connected in series between the second node N2 and a fifth node N5, and each of the $k+1^{th}$ through $n^{th}$ resistors Rk+1, Rk+2, . . . , and Rn may have one terminal connected to the fifth node N5 and the other terminal connected to a corresponding switch of the $k+1^{th}$ through $n^{th}$ switches Tk+1, Tk+2, . . . , and Tn. Each of the first through $k^{th}$ switches T1, T2, . . . , and Tk connected between both terminals of a corresponding resistor of the first through $k^{th}$ resistors R1, R2, . . . , and Rk may be closed to create a short-circuit or may be opened in response to a corresponding bit of first through $k^{th}$ bits CON_1, CON_2, . . . , and CON_k of the control signal CON. Each of the $k+1^{th}$ through $n^{th}$ switches Tk+1, Tk+2, . . . , and Tn may control whether to connect the first voltage source V1 to a corresponding resistor of the $k+1^{th}$ through $n^{th}$ resistors Rk+1, Rk+2, . . . , and Rn in response to a corresponding bit of $k+1^{th}$ through $n^{th}$ bits CON_k+1, CON_k+2, . . . , and CON_n of the control signal CON.

The second resistor unit 750 may include first through $n^{th}$ resistors R1, R2, . . . , and Rn (where n is a natural number) and first through $n^{th}$ switches T1, T2, . . . , and Tn. The first through $k^{th}$ resistors (where k is a natural number greater than 1 and less than n) may be connected in series between the third node N3 and the fifth node N5, and each of the $k+1^{th}$ through $n^{th}$ resistors Rk+1, Rk+2, . . . , and Rn may have one terminal connected to the fifth node N5 and the other terminal connected to a corresponding switch of the $k+1^{th}$ through $n^{th}$ switches Tk+1, Tk+2, . . . , and Tn. Each of the first through $k^{th}$ switches T1, T2, . . . , and Tk connected between both terminals of a corresponding resistor of the first through $k^{th}$ resistors R1, R2, . . . , and Rk may be closed to create a short-circuit or may be opened in response to a corresponding bit of first through $k^{th}$ bits CON_1, CON_2, . . . , and CON_k of the control signal CON. Each of the $k+1^{th}$ through $n^{th}$ switches Tk+1, Tk+2, . . . , and Tn may control whether to connect the first voltage source V1 to a corresponding resistor of the $k+1^{th}$ through $n^{th}$ resistors Rk+1, Rk+2, . . . , and Rn in response to a corresponding bit of $k+1^{th}$ through $n^{th}$ bits CON_k+1, CON_k+2, . . . , and CON_n of the control signal CON.

FIG. 8C is a combination of FIGS. 8A and 8B. In FIG. 8C, the first through $n^{th}$ switches T1, T2, . . . , and Tn are NMOS transistors. However, the present embodiment is not limited thereto, and another device may be used as described with reference to FIGS. 8A and 8B.

The calibration circuits 100, 500, and 700 of FIGS. 1, 5, and 7 may be ZQ calibration circuits, and the pads PADs of FIGS. 1, 5, and 7 may be ZQ pads.

While the inventive concept has been particularly shown and described with reference to exemplary embodiments thereof using specific terms, the embodiments and terms have been used to explain the inventive concept and should not be construed as limiting the scope of the inventive concept defined by the claims. The preferred embodiments should be considered in a descriptive sense only and not for purposes of limitation. Therefore, the scope of the inventive concept is defined not by the detailed description of the inventive concept but by the appended claims, and all differences within the scope will be construed as being included in the inventive concept.

What is claimed is:

1. A calibration circuit comprising:

a pad connected between an external resistor connected to a first voltage source and a first node;

a first resistor unit connected between the first node and a second voltage source and having an impedance that is determined in response to a first control signal;

a second resistor unit connected between a second node and the second voltage source and having an impedance that is determined in response to a second control signal;

a first control unit for generating and outputting a first output signal by using a voltage level of the first node and a voltage level of the second node;

a first pull-down circuit connected between the second node and the first voltage source and having an impedance that is determined in response to the first output signal;

a second pull-down circuit connected between a third node and the first voltage source and having an impedance that is determined in response to the first output signal;

a second control unit for generating and outputting a second output signal by using a voltage level of the third node and a voltage level of a reference voltage; and a pull-up circuit connected between the third node and the second voltage source and having an impedance that is determined in response to the second output signal.

2. The calibration circuit of claim 1, wherein the first control unit generates and outputs the first output signal that determines the impedance of the first pull-down circuit so that the voltage level of the first node is the same as the voltage level of the second node, and the second control unit generates and outputs the second output signal that determines the impedance of the pull-up circuit so that the voltage level of the third node is the same as the voltage level of the reference voltage.

3. The calibration circuit of claim 1, wherein the first resistor unit comprises:

a plurality of first resistors connected between the first node and the second voltage source; and a plurality of first switches that are each for connecting a corresponding first resistor of the plurality of first resistors to the first node or the second voltage source, or that are each connected between both terminals of the corresponding first resistor and are each for being closed to create a short-circuit or being opened in response to a corresponding bit of a plurality of bits of the first control signal.

4. The calibration circuit of claim 1, wherein the second resistor unit comprises:

a plurality of second resistors connected between the second node and the second voltage source; and a plurality of second switches that are each for connecting a corresponding second resistor of the plurality of second resistors to the second node or the second voltage source, or that are each connected between both terminals of the corresponding first resistor and are each for being closed to create a short-circuit or being opened in response to a corresponding bit of a plurality of bits of the first control signal.

5. The calibration circuit of claim 1, wherein the first control unit comprises:

a first comparator having a first input terminal connected to the first node and a second input terminal connected to the second node; and a first counter for generating the first output signal in response to an output signal of the first comparator, and the second control unit comprises:

a second comparator having a first input terminal connected to the third node and a second input terminal to which the reference voltage is applied; and a second counter for generating the second output signal in response to an output signal of the second comparator.

6. The calibration circuit of claim 1, wherein the reference voltage has the voltage level that is in the middle between a voltage level of the first voltage source and a voltage level of the second voltage source.

7. A calibration circuit comprising:

a pad connected between an external resistor connected to a first voltage source and a first node connected to a second voltage source;

a first control unit for generating and outputting a first output signal by using a voltage level of the first node and a voltage level of a second node connected to the second voltage source;

a first pull-down circuit connected between the second node and the first voltage source and having an impedance that is determined in response to the first output signal;

a second pull-down circuit connected between a third node and the first voltage source and having an impedance that is determined in response to the first output signal;

a second control unit for generating and outputting a second output signal by using a voltage level of the third node and a voltage level of a reference voltage; and a pull-up circuit connected between the third node and the second voltage source and having an impedance that is determined in response to the second output signal.

8. The calibration circuit of claim 7, wherein the first control unit generates and outputs the first output signal that determines the impedance of the first pull-down circuit so that the voltage level of the first node is the same as the voltage level of the second node, and the second control unit generates and outputs the second output signal that determines the impedance value of the pull-up circuit so that the voltage level of the third node is the same as the voltage level of the reference voltage.

9. The calibration circuit of claim 7, further comprising:

a first switching unit for controlling whether to connect the second voltage source to the first node in response to an enable signal; and a second switching unit for controlling whether to connect the second voltage source to the second node in response to the enable signal.

10. The calibration circuit of claim 7, wherein the first control unit comprises:

a first comparator having a first input terminal connected to the first node and a second input terminal connected to the second node; and a first counter for generating the first output signal in response to an output signal of the first comparator, and the second control unit comprises:

a second comparator having a first input terminal connected to the third node and a second input terminal to which the reference voltage is applied; and a second counter for generating the second output signal in response to an output signal of the second comparator.

11. The calibration circuit of claim 7, wherein the voltage level of the reference voltage is in the middle between a voltage level of the first voltage source and a voltage level of the second voltage source.

* * * * *